(12) United States Patent
Oiwa

(10) Patent No.: US 7,158,191 B2
(45) Date of Patent: Jan. 2, 2007

(54) VIDEO SIGNAL PROCESSING APPARATUS

(75) Inventor: Koji Oiwa, Sakai (JP)

(73) Assignee: Sharp Kabushiki Kaisha, Osaka (JP)

( * ) Notice: Subject to any disclaimer, the term of this patent is extended or adjusted under 35 U.S.C. 154(b) by 519 days.

(21) Appl. No.: 10/367,835

(22) Filed: Feb. 19, 2003

(65) Prior Publication Data
US 2003/0156221 A1  Aug. 21, 2003

(30) Foreign Application Priority Data
Feb. 21, 2002  (JP) ............................. 2002-044954

(51) Int. Cl.
*H04N 5/50* (2006.01)
(52) U.S. Cl. ..................... 348/733; 348/731; 348/725
(58) Field of Classification Search .............. 348/711, 348/725, 505, 506, 507, 508, 509, 731, 732, 348/733, 735, 736–738, 726
See application file for complete search history.

(56) References Cited

U.S. PATENT DOCUMENTS 4,237,476 A * 12/1980 Hanma et al. .............. 348/711
4,366,498 A * 12/1982 Theriault .................... 348/711
4,604,645 A *  8/1986 Lewis, Jr. ................... 348/646
4,649,420 A *  3/1987 Kelly et al. ................. 348/711

FOREIGN PATENT DOCUMENTS

| JP | 61-151442 | 9/1986 |
| JP | 05-056363 | 3/1993 |
| JP | 05-260483 | 10/1993 |
| JP | 2000-217012 A | 8/2000 |

* cited by examiner

*Primary Examiner*—Michael H. Lee
(74) *Attorney, Agent, or Firm*—Nixon & Vanderhye, PC

(57) ABSTRACT

Example burst signal sampling circuitry including synchronous separator circuit(s), waveshaping circuit(s), bandpass amplifier circuit(s), and burst separator circuit(s) is provided in order to extract burst signal(s) from video signal(s) output from video amplifier circuit(s). Level converting circuitry ACC detector/amplifier circuit(s) is provided in order to convert fluctuation in the burst signal(s) to DC voltage(s). This DC voltage(s) is fed back by way of intervening control circuit(s) to the cathode side(s) of input tuning variable capacitance diode(s) constituting frequency characteristics correction circuit(s) of input tuning circuit(s).

20 Claims, 9 Drawing Sheets

VIDEO SIGNAL PROCESSING APPARATUS

BACKGROUND OF INVENTION

The present invention pertains to a video signal processing circuit for a television receiver, and more specifically relates to a video signal processing apparatus for correcting video signal frequency band characteristics.

CONVENTIONAL ART

FIG. 9 is the circuit structure of a conventional television receiver which is made up of tuner circuit 1 comprising input tuning circuit 11, high frequency amplifier circuit 12, interstage tuning circuit 13, PLL circuit 14, local oscillator 15, mixer circuit 16, and intermediate frequency tuning circuit 17; and video signal processing circuit 2 comprising SAW filter 21, video intermediate frequency amplifier circuit 22, video detector circuit 23, video amplifier circuit 24, AGC detector circuit 25, AGC circuit 26, audio detector circuit 27, audio intermediate frequency amplifier circuit 28, and FM detector circuit 29.

That is, a received high frequency signal, after selection of a prescribed channel therefrom at input tuning circuit 11, is amplified at high frequency amplifier circuit 12 which represents the next stage, interfering signals are furthermore removed therefrom at interstage tuning circuit 13, and this is then input at mixer circuit 16. In addition, at mixer circuit 16, this mixes with a local oscillator frequency signal generated by local oscillator 15 and is converted to an intermediate frequency signal; and extraneous signal components are removed therefrom at intermediate frequency tuning circuit 17, following which this is input at video signal processing circuit 2. PLL circuit 14 is a circuit for controlling the local oscillator frequency generated by oscillation of local oscillator 15 so as to make it constant.

At video signal processing circuit 2, the intermediate frequency signal input thereto passes through SAW filter 21 where extraneous signal components are first removed therefrom, following which this is amplified at video intermediate frequency amplifier circuit 22. The amplified video signal is thereafter detected at video detector circuit 23, and this is input at video amplifier circuit 24. Furthermore, the video signal amplified at video amplifier circuit 24 is detected at AGC detector circuit 25, and at AGC circuit 26 the detected video signal is utilized to determine the strength of the input radio waves, a control signal for controlling output intensity level so as to make same constant being input at video intermediate frequency amplifier circuit 22.

On the other hand, the audio signal is detected at audio detector circuit 27 and is made into an audio intermediate frequency signal, and following amplification at audio intermediate frequency amplifier circuit 28, this is detected at FM detector circuit 29.

Now, recent tuner circuits employ electronic tuning wherein the respective tuning circuits employ variable capacitance diodes which are such that variation in the reverse voltage (tuning voltage) applied thereto causes variation in capacitance. As a result, there is the problem of increased tendency for tracking errors to occur due to variation in capacitors, diodes, and other such components, causing frequency characteristics of the received video signal to vary across received channels.

Particularly with the recent trend toward increased channel number, because the fact of increasingly strict constraints with respect to adjacent channel interference and various other types of interference means that there will be increased change in tuning frequency at the respective tuning circuits for a given change in tuning voltage, increased tuning circuit selectivity becomes necessary. This therefore results in the problem that tracking errors become difficult to avoid.

What this means is that if frequency characteristics become such that high-frequency intensity levels, for example, drop relative to low-frequency intensity levels as a result of variation in video signal frequency characteristics due to tracking error, image color will become less crisp. Or if frequency characteristics become such that high-frequency intensity levels rise relative to low-frequency intensity levels, image color will become harsh. Fluctuation in image quality across channels due to tracking error in tuner circuits has thus been a problem in television receivers and video equipment where high image quality is sought.

SUMMARY OF INVENTION

The present invention was conceived in order to solve such problems, its object being to provide a video signal processing apparatus permitting attainment of stable image quality irrespective of any tuner circuit tracking error.

In order to solve one or more of the foregoing problems, a video signal processing apparatus in one or more embodiments of the present invention may be characterized in that it is equipped with one or more burst signal sampling means for extracting one or more burst signals from one or more video signals; one or more level converting means for converting to DC voltage or voltages at least one variable intensity level of at least one of the burst signal or signals extracted by at least one of the burst signal sampling means; and one or more image quality correcting means for causing at least one of the DC voltage or voltages obtained as a result of conversion by at least one of the level converting means to be fed back into one or more compensator subcircuits of one or more input tuning circuits so as to permit correction of frequency characteristics of at least one of the video signal or signals such that intensity level at one or more high frequency bands is constant relative to intensity level at one or more low frequency bands. At least some such embodiments may further be characterized in that at least one of the compensator subcircuit or subcircuits employs one or more input tuning variable capacitance diodes.

That is, as shown at (a) and (b) in FIG. 6, if frequency characteristics F of a video signal output from a video amplifier circuit are such that intensity levels in a high frequency band thereof increase (see F1 at (a) in FIG. 6) or decrease (see F2 at (b) in FIG. 6) relative to intensity levels in a low frequency band thereof, the intensity level EB of a burst signal present within the video signal output from the video amplifier circuit will likewise increase (see EB1 at (a) in FIG. 6) or decrease (see EB2 at (b) in FIG. 6) in correspondence thereto. At least some such embodiments of the present invention are concerned with this correlation between changes in the frequency characteristics F of the video signal and changes in the intensity level EB of the burst signal. A constitution may therefore be adopted in which burst signal sampling means comprising synchronous separator circuit(s), waveshaping circuit(s), bandpass amplifier circuit(s), and burst separator circuit(s) is or are provided in order to extract burst signal(s) from video signal(s) output from video amplifier circuit(s); level converting means comprising ACC detector/amplifier circuit(s) is or are moreover provided in order to convert fluctuation in burst signal(s) to DC voltage(s); and such DC voltage(s) is or are fed back by way of intervening control means to the cathode side(s) of input tuning variable capacitance diode(s) constituting correction circuit(s) of input tuning circuit(s). This permits video signal frequency characteristics to be controlled such that high-frequency intensity levels are constant relative to low-frequency intensity levels. That is, because burst intensity levels (color intensity levels) are controlled so as to remain constant, elimination of variation in image quality across channels is permitted.

A video signal processing apparatus in at least some such embodiments of the present invention may further be characterized in that one or more sets of one or more capacitors connected in series to one or more variable capacitance diodes are connected in parallel to at least one input tuning variable capacitance diode; and at least one DC voltage is supplied by way of one or more intervening resistors to the cathode side of at least one variable capacitance diode. The capacitor(s) and variable capacitance diode(s) connected in series and the resistor(s) represent important features in at least some such embodiments of the present invention, the capacitor(s) serving as compensating capacitor(s) for variable capacitance diode(s), and the resistor(s) serving as bias resistor(s) for variable capacitance diode(s). That is, application of DC voltage(s), by way of control circuit(s), to the cathode side(s) of variable capacitance diode(s) permits control of resonant frequency or frequencies.

A video signal processing apparatus in at least some such embodiments of the present invention may further be characterized in that at least one of the compensator subcircuit or subcircuits employs one or more sets of one or more input tuning capacitors connected in series to one or more input tuning variable capacitance diodes; one or more sets of one or more capacitors connected in series to one or more variable capacitance diodes are connected in parallel to at least one of the set or sets of input tuning capacitor or capacitors and input tuning variable capacitance diode or diodes; and at least one of the DC voltage or voltages is supplied by way of one or more intervening resistors to the cathode side of at least one of the variable capacitance diode or diodes. The capacitor(s) and variable capacitance diode(s) connected in series and the resistor(s) represent important features in at least some such embodiments of the present invention, the capacitor(s) serving as compensating capacitor(s) for variable capacitance diode(s), and the resistor(s) serving as bias resistor(s) for variable capacitance diode(s). That is, application of DC voltage(s), by way of control circuit(s), to the cathode side(s) of variable capacitance diode(s) permits control of resonant frequency or frequencies.

A video signal processing apparatus in at least some such embodiments of the present invention may further be characterized in that at least one of the compensator subcircuit or subcircuits employs one or more input tuning coils and one or more input tuning capacitors; one or more variable capacitance diodes are connected between at least one of the input tuning coil or coils and at least one of the input tuning capacitor or capacitors; and at least one of the DC voltage or voltages is supplied by way of one or more intervening resistors to the cathode side of at least one of the variable capacitance diode or diodes. The variable capacitance diode(s) and resistor(s) represent important features in at least some such embodiments of the present invention, the resistor(s) serving as bias resistor(s) for variable capacitance diode(s). That is, application of DC voltage(s), by way of control circuit(s), to the cathode side(s) of variable capacitance diode(s) permits control of resonant frequency or frequencies.

Furthermore, a video signal processing apparatus in one or more embodiments of the present invention may be characterized in that it is equipped with one or more burst signal sampling means for extracting one or more burst signals from one or more video signals; one or more level converting means for converting to DC voltage or voltages at least one variable intensity level of at least one of the burst signal or signals extracted by at least one of the burst signal sampling means; and one or more image quality correcting means for causing at least one of the DC voltage or voltages obtained as a result of conversion by at least one of the level converting means to be fed back into one or more compensator subcircuits of one or more interstage tuning circuits so as to permit correction of frequency characteristics of at least one of the video signal or signals such that intensity level at one or more high frequency bands is constant relative to intensity level at one or more low frequency bands. At least some such embodiments of the present invention may further be characterized in that at least one of the compensator subcircuit or subcircuits employs one or more interstage tuning variable capacitance diodes.

At least some such embodiments of the present invention are also concerned with the correlation between changes in the frequency characteristics F of the video signal and changes in the intensity level EB of the burst signal, as shown at (a) and (b) in FIG. 6. A constitution may therefore be adopted in which burst signal sampling means comprising synchronous separator circuit(s), waveshaping circuit(s), bandpass amplifier circuit(s), and burst separator circuit(s) is or are provided in order to extract burst signal(s) from video signal(s) output from video amplifier circuit(s); level converting means comprising ACC detector/amplifier circuit(s) is or are moreover provided in order to convert fluctuation in burst signal(s) to DC voltage(s); and such DC voltage(s) is or are fed back by way of intervening control means to the cathode side(s) of interstage tuning variable capacitance diode(s) constituting compensator subcircuit(s) (frequency characteristics correction circuit(s)) of interstage tuning circuit(s). This permits video signal frequency characteristics to be controlled such that high-frequency intensity levels are constant relative to low-frequency intensity levels. That is, because burst intensity levels (color intensity levels) are controlled so as to remain constant, elimination of variation in image quality across channels is permitted.

A video signal processing apparatus in at least some such embodiments of the present invention may further be characterized in that one or more sets of one or more capacitors connected in series to one or more variable capacitance diodes are connected in parallel to at least one of the interstage tuning variable capacitance diode or diodes; and at least one of the DC voltage or voltages is supplied by way of one or more intervening resistors to the cathode side of at least one of the variable capacitance diode or diodes. The capacitor(s) and variable capacitance diode(s) connected in series and the resistor(s) represent important features in at least some such embodiments of the present invention, the capacitor(s) serving as compensating capacitor(s) for variable capacitance diode(s), and the resistor(s) serving as bias resistor(s) for variable capacitance diode(s). That is, application of DC voltage(s), by way of control circuit(s), to the cathode side(s) of variable capacitance diode(s) permits control of resonant frequency or frequencies.

A video signal processing apparatus in at least some such embodiments of the present invention may further be characterized in that at least one of the compensator subcircuit or subcircuits employs one or more sets of one or more interstage tuning capacitors connected in series to one or more interstage tuning variable capacitance diodes; one or more sets of one or more capacitors connected in series to one or more variable capacitance diodes are connected in parallel to at least one of the set or sets of interstage tuning capacitor or capacitors and interstage tuning variable capacitance diode or diodes; and at least one of the DC voltage or voltages is supplied by way of one or more intervening resistors to the cathode side of at least one of the variable capacitance diode or diodes. The capacitor(s) and variable capacitance diode(s) connected in series and the resistor(s) represent important features in at least some such embodiments of the present invention, the capacitor(s) serving as compensating capacitor(s) for variable capacitance diode(s), and the resistor(s) serving as bias resistor(s) for variable capacitance diode(s). That is, application of DC voltage(s), by way of control circuit(s), to the cathode side(s) of variable capacitance diode(s) permits control of resonant frequency or frequencies.

A video signal processing apparatus in at least some such embodiments of the present invention may further be characterized in that at least one of the compensator subcircuit or subcircuits employs one or more interstage tuning coils and one or more interstage tuning capacitors; one or more variable capacitance diodes are connected between at least one of the interstage tuning coil or coils and at least one of the interstage tuning capacitor or capacitors; and at least one of the DC voltage or voltages is supplied by way of one or more intervening resistors to the cathode side of at least one of the variable capacitance diode or diodes. The variable capacitance diode(s) and resistor(s) represent important features in at least some such embodiments of the present invention, the resistor(s) serving as bias resistor(s) for variable capacitance diode(s). That is, application of DC voltage (s), by way of control circuit(s), to the cathode side(s) of variable capacitance diode(s) permits control of resonant frequency or frequencies.

BRIEF DESCRIPTION OF DRAWINGS

FIG. 6(*b*) is an explanatory diagram showing a burst signal in a case where video signal frequency characteristics are such that intensity levels in a high frequency band are lower than intensity levels in a low frequency band.

FIG. 7(*b*) is an explanatory diagram showing tuning circuit selectivity characteristics in a circuit in accordance with the present invention and video signal frequency characteristics during occurrence of tracking error, together with burst signal intensity level at such time.

DESCRIPTION OF PREFERRED EMBODIMENTS

Below, embodiments of the present invention are described with reference to the drawings.

Figure 1:
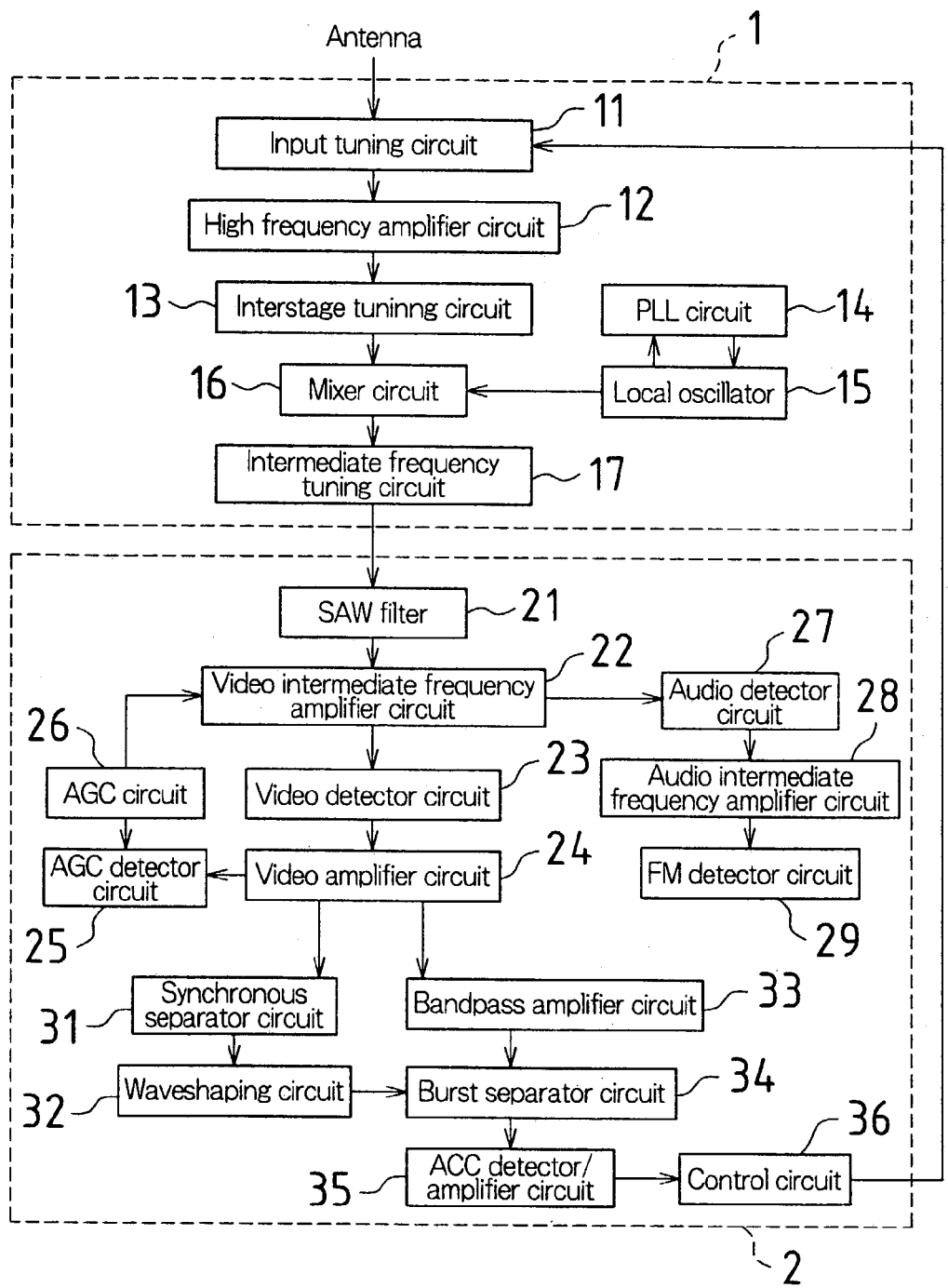
FIG. 1 is a block diagram showing circuit structure in a television receiver containing a video signal processing apparatus associated with a first embodiment of the present invention.
Figure 9:
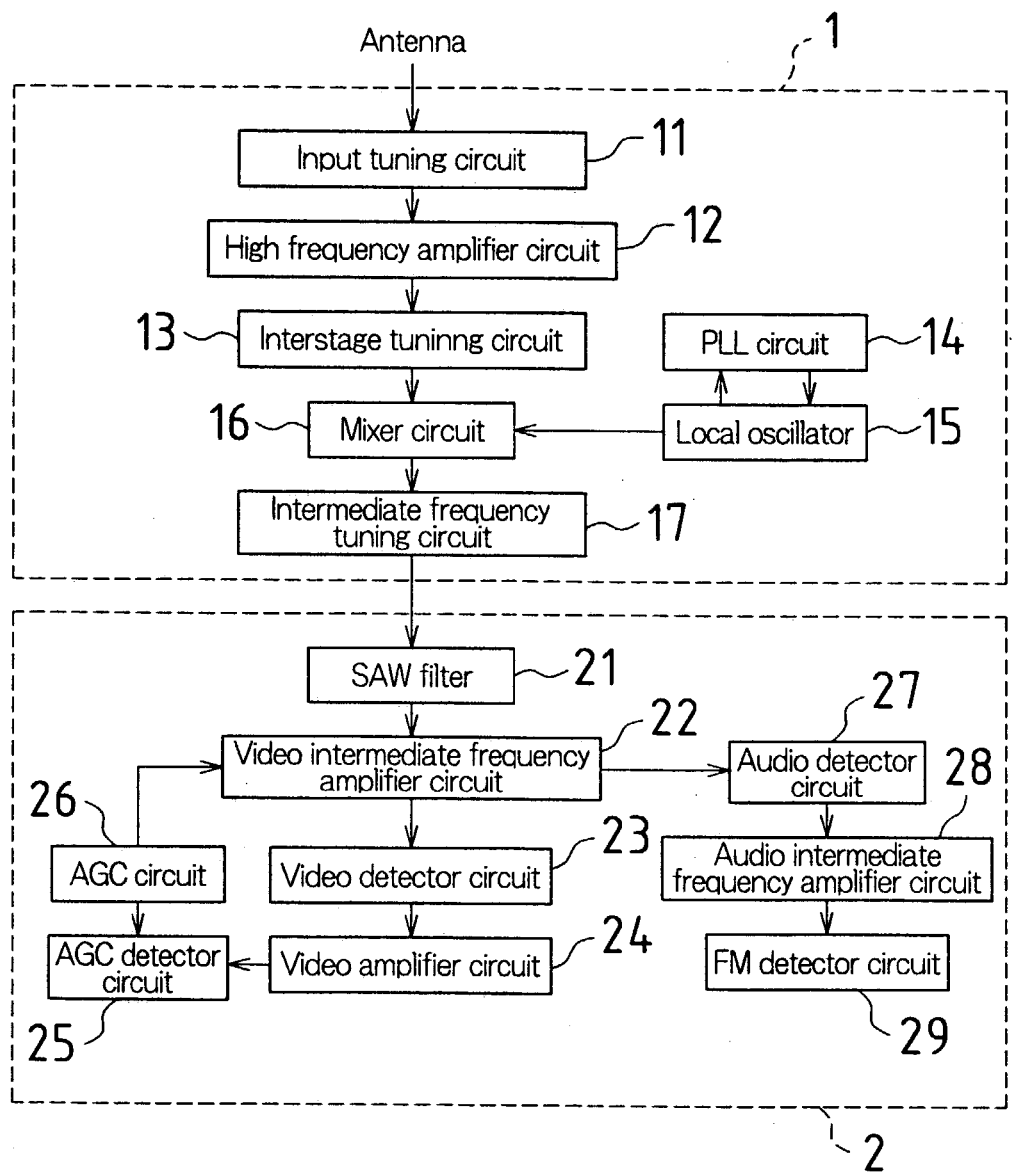
FIG. 9 is a block diagram showing circuit structure in a conventional television receiver.

FIG. 1 is a block diagram showing circuit structure in a television receiver containing a video signal processing apparatus associated with a first embodiment of the present invention; in the drawing, reference numeral 11 is an input tuning circuit, 12 is a high frequency amplifier circuit, 13 is an interstage tuning circuit, 14 is a PLL circuit, 15 is a local oscillator, 16 is a mixer circuit, 17 is an intermediate frequency tuning circuit, 21 is a SAW filter, 22 is a video intermediate frequency amplifier circuit, 23 is a video detector circuit, 24 is a video amplifier circuit, 25 is an AGC detector circuit, 26 is an AGC circuit, 27 is an audio detector circuit, 28 is an audio intermediate frequency amplifier circuit, and 29 is an FM detector circuit. Such structure being similar to circuit structure in the conventional television receiver shown in FIG. 9, detailed description thereof will be omitted here.

In one or more embodiments of the present invention, in addition to the foregoing circuit structure, burst signal sampling means comprising synchronous separator circuit (s) 31, waveshaping circuit(s) 32, bandpass amplifier circuit (s) 33, and burst separator circuit(s) 34 is or are provided in order to extract burst signal(s) from video signal(s) output from video amplifier circuit(s) 24; level converting means comprising ACC detector/amplifier circuit(s) 35 is or are moreover provided in order to convert fluctuation in burst signal(s) obtained as a result of separation by burst separator circuit(s) 34 to DC voltage(s); and such DC voltage(s) is or are fed back by way of intervening control circuit(s) 36 to frequency characteristics correction circuit(s), not shown, of input tuning circuit(s) 11.

That is, video signal(s) output from video amplifier circuit (s) 24 is or are input at synchronous separator circuit(s) 31 and bandpass amplifier circuit(s) 33. Synchronous separator circuit(s) 31 extracts or extract synchronous signal(s) from the video signal(s) input thereto, at least a portion of such synchronous signal(s) then being input at waveshaping circuit(s) 32. Waveshaping circuit(s) 32 create gate pulse(s) for sampling of burst signal(s) from such synchronous signal(s) based on the synchronous signal(s) input thereto.

Moreover, bandpass amplifier circuit(s) 33 extracts or extract carrier chrominance signal(s) from the video signal (s) input thereto, at least a portion of such carrier chrominance signal(s) then being input at burst separator circuit(s) 34. Burst separator circuit(s) 34 extracts or extract carrier burst signal(s) from the carrier chrominance signal(s) input thereto in accordance with gate pulse(s) delivered thereto from waveshaping circuit(s) 32. In addition, such extracted burst signal(s) is or are input at ACC detector/amplifier circuit(s) 35, where this is converted into DC voltage(s) in correspondence to fluctuation in intensity level(s) of at least a portion of the burst signal(s), and at least a portion of such DC voltage(s) is fed back, by way of control circuit(s) 36, into frequency characteristics correction circuit(s) of input tuning circuit(s) 11, as a result of which frequency characteristics correction circuit(s) may be controlled so as to cause frequency characteristics of video signal(s) to be such that intensity level(s) at high frequency band(s) is or are constant relative to intensity level(s) at low frequency band (s).

This makes it possible to cause burst intensity levels (color intensity levels) to be held constant despite occurrence of variation in frequency band characteristics due to tracking error at tuner circuit(s), permitting channel-to-channel variation in high-frequency intensity levels relative to low-frequency intensity levels, this representing an aspect of video signal frequency characteristics, to be held to a minimum.

Figure 2:
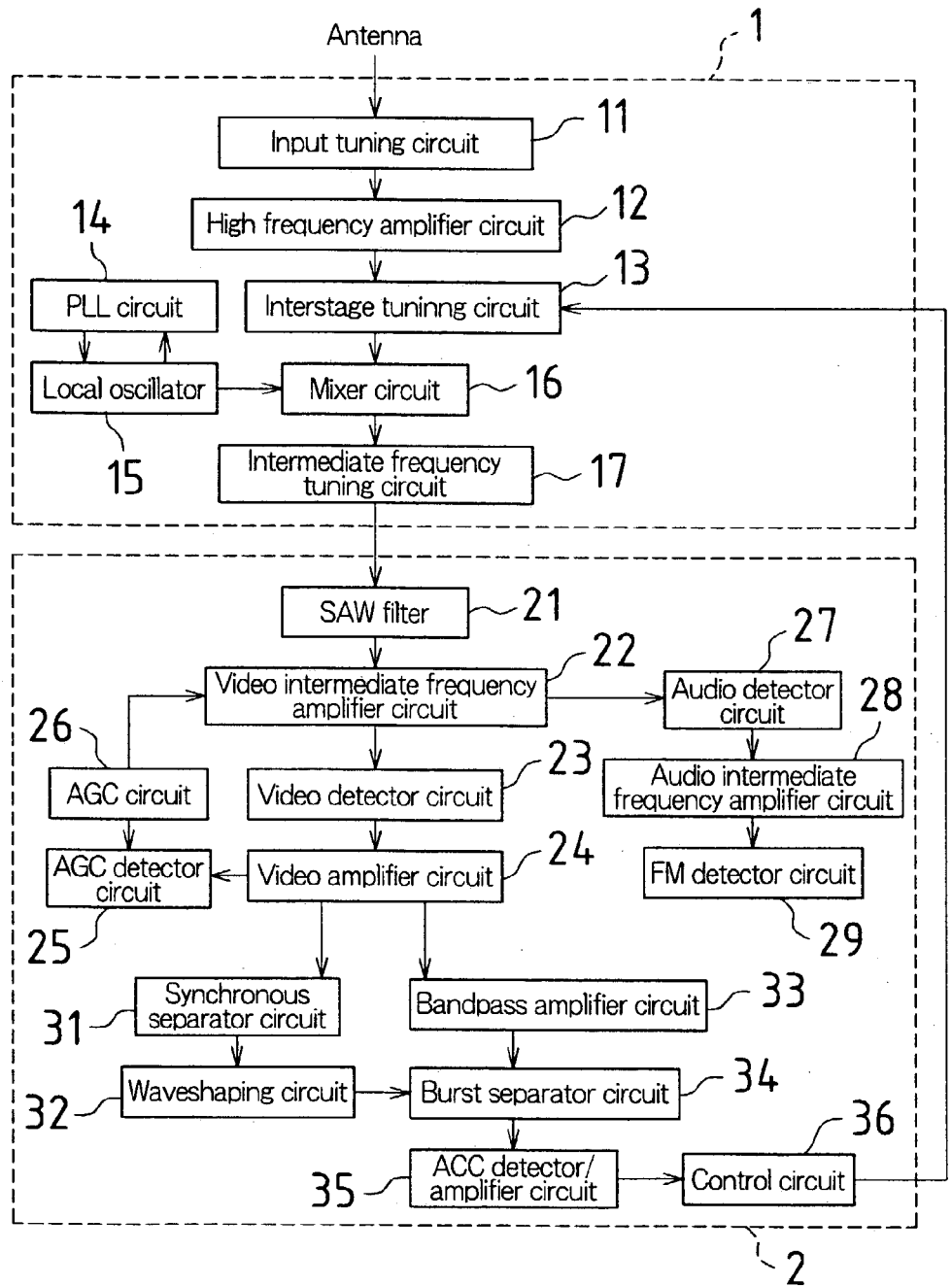
FIG. 2 is a block diagram showing circuit structure in a television receiver containing a video signal processing apparatus associated with a second embodiment of the present invention.

FIG. 2 is a block diagram showing circuit structure in a television receiver containing a video signal processing apparatus associated with a second embodiment of the present invention. The only difference between the television receiver circuit structure shown in FIG. 2 and the television receiver circuit structure shown in FIG. 1 is that whereas at FIG. 1 at least a portion of the control output from control circuit(s) 36 is fed back to frequency characteristics correction circuit(s) of input tuning circuit(s) 11, at FIG. 2 at least a portion of the control output from control circuit(s) 36 is fed back to frequency characteristics correction circuit(s), not shown, of interstage tuning circuit(s) 13.

Next, specific examples of frequency characteristics correction circuits for implementing video signal processing apparatuses associated with the present embodiment(s) will be described with reference to the circuit diagrams shown in FIG. 3 through FIG. 5 and the characteristics diagrams shown in FIG. 7 and FIG. 8.

FREQUENCY CHARACTERISTICS CORRECTION CIRCUIT WORKING EXAMPLE 1

Figure 3:
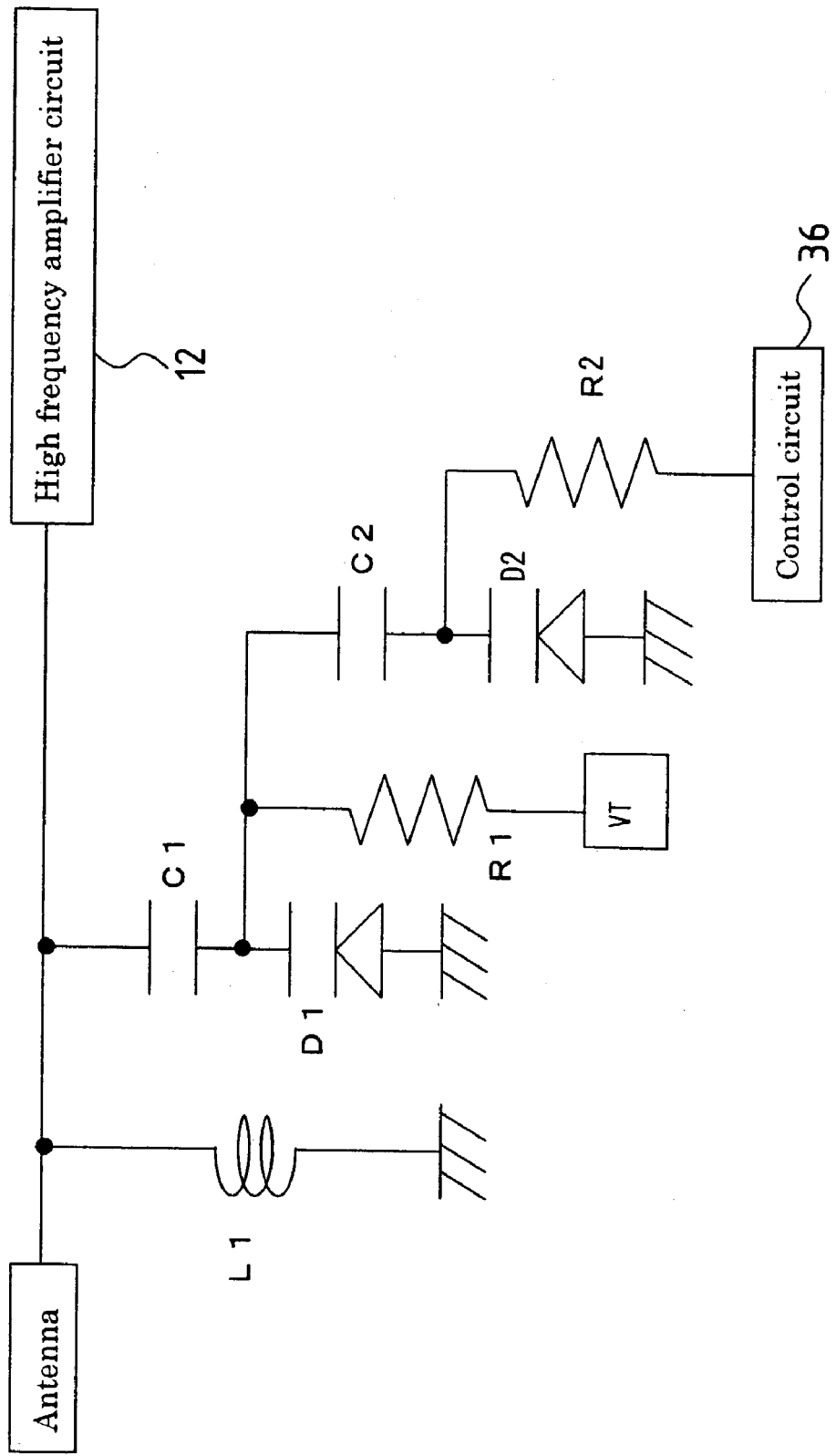
FIG. 3 is a working example of a frequency characteristics correction circuit for implementing a video signal processing apparatus associated with an embodiment of the present invention.

FIG. 3 is a circuit diagram of a frequency characteristics correction circuit corresponding to claim 3. This frequency characteristics correction circuit is such that coil L1, and the set of components comprising input tuning capacitor C1 and input tuning variable capacitance diode D1 which is connected in series thereto, are connected in parallel between an input signal line from an antenna, not shown, and ground, a bandpass filter (hereinafter "BPF") being formed by this coil L1, this input tuning capacitor C1, and this input tuning variable capacitance diode D1. In addition, change in the resonant frequency of the BPF is made possible through supply of VT voltage (Tuning Variable voltage; hereinafter "voltage VT") to the cathode side of input tuning variable capacitance diode D1 by way of resistor R1.

Furthermore, the set of components comprising capacitor C2 and variable capacitance diode D2 which is connected in series thereto, is connected between the cathode side of input tuning variable capacitance diode D1 and ground, DC voltage being supplied to the cathode side of variable capacitance diode D2 from control circuit 36 by way of resistor R2. Correction of the resonant frequency of the BPF is thus made possible through supply of DC voltage from control circuit 36 to the cathode side of variable capacitance diode D2 by way of resistor R2.

That is, capacitor C2, variable capacitance diode D2, and resistor R2 represent important features in the present working example. In the present working example, capacitor C2 serves as compensating capacitor for variable capacitance diode D2, and resistor R2 serves as bias resistor for variable capacitance diode D2.

FREQUENCY CHARACTERISTICS CORRECTION CIRCUIT WORKING EXAMPLE 2

Figure 4:
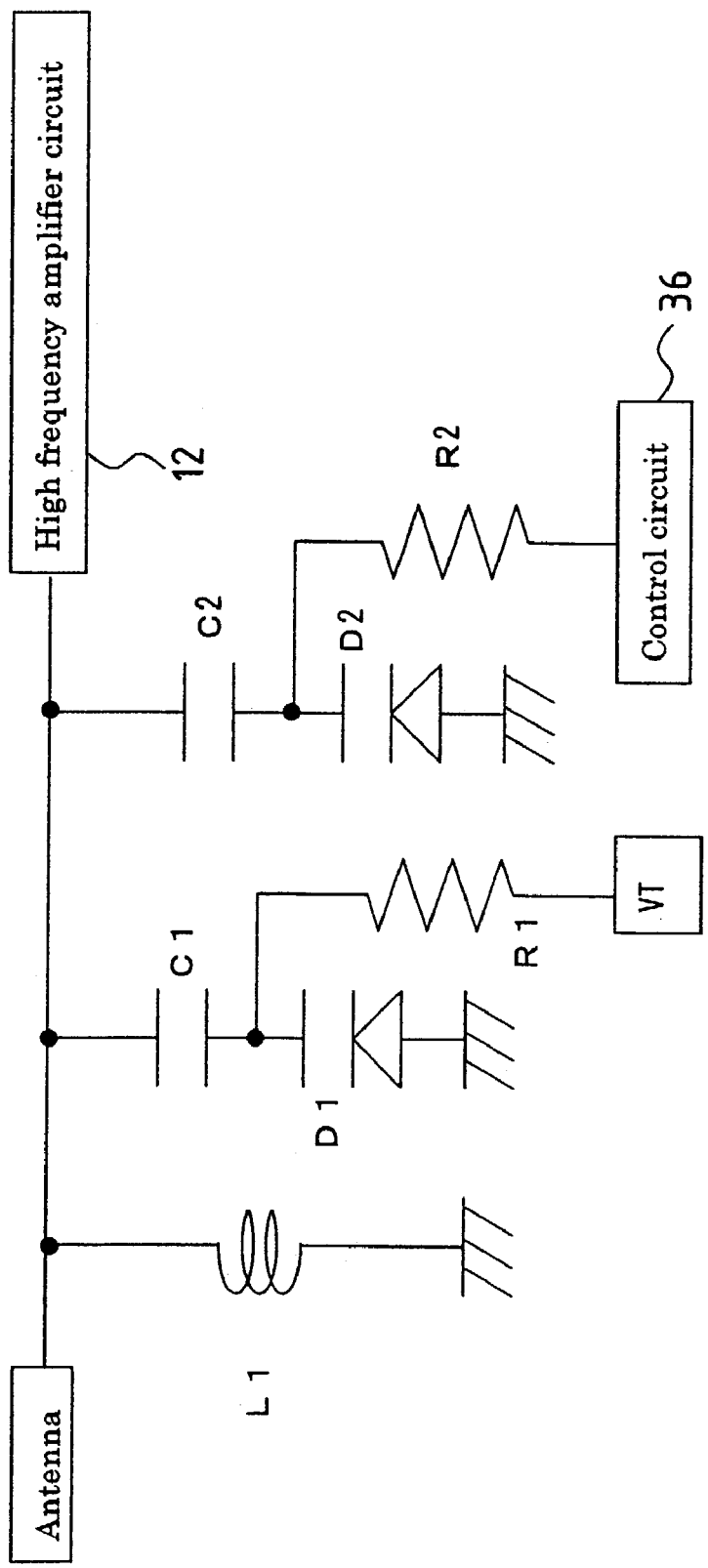
FIG. 4 is another working example of a frequency characteristics correction circuit for implementing a video signal processing apparatus associated with an embodiment of the present invention.

FIG. 4 is a circuit diagram of a frequency characteristics correction circuit corresponding to claim 4. This frequency characteristics correction circuit is such that coil L1, and the set of components comprising input tuning capacitor C1 and input tuning variable capacitance diode D1 which is connected in series thereto, are connected in parallel between an input signal line from an antenna, not shown, and ground, a BPF being formed by this coil L1, this input tuning capacitor C1, and this input tuning variable capacitance diode D1. In addition, change in the resonant frequency of the BPF is made possible through supply of voltage VT to the cathode side of input tuning variable capacitance diode D1 by way of resistor R1.

Furthermore, the set of components comprising capacitor C2 and variable capacitance diode D2 which is connected in series thereto, is connected between the antenna input signal line and ground, DC voltage being supplied to the cathode side of variable capacitance diode D2 from control circuit 36 by way of resistor R2. Correction of the resonant frequency of the BPF is thus made possible through supply of DC voltage from control circuit 36 to the cathode side of variable capacitance diode D2 by way of resistor R2.

That is, capacitor C2, variable capacitance diode D2, and resistor R2 represent important features in the present working example. In the present working example, capacitor C2 serves as compensating capacitor for variable capacitance diode D2, and resistor R2 serves as bias resistor for variable capacitance diode D2.

FREQUENCY CHARACTERISTICS CORRECTION CIRCUIT WORKING EXAMPLE 3

Figure 5:
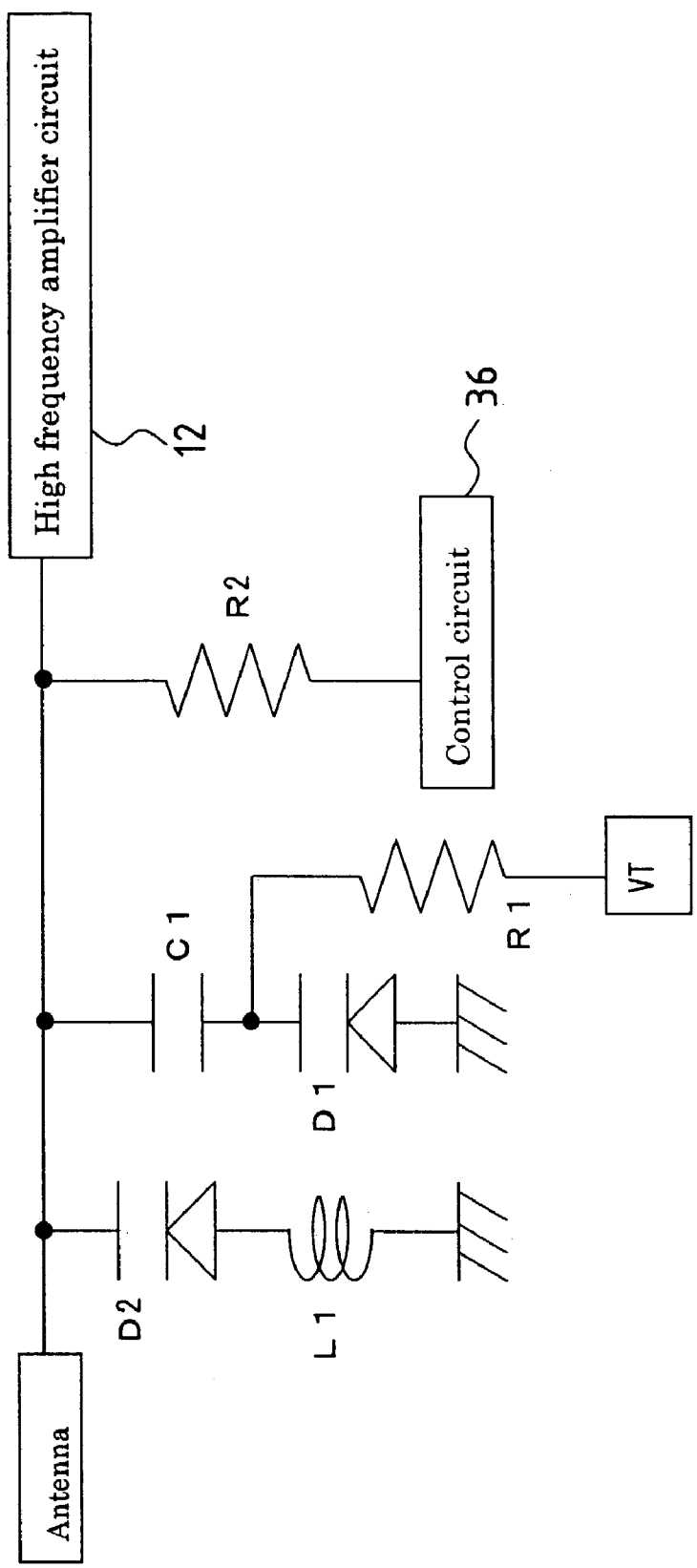
FIG. 5 is a different working example of a frequency characteristics correction circuit for implementing a video signal processing apparatus associated with an embodiment of the present invention.
Figure 6:
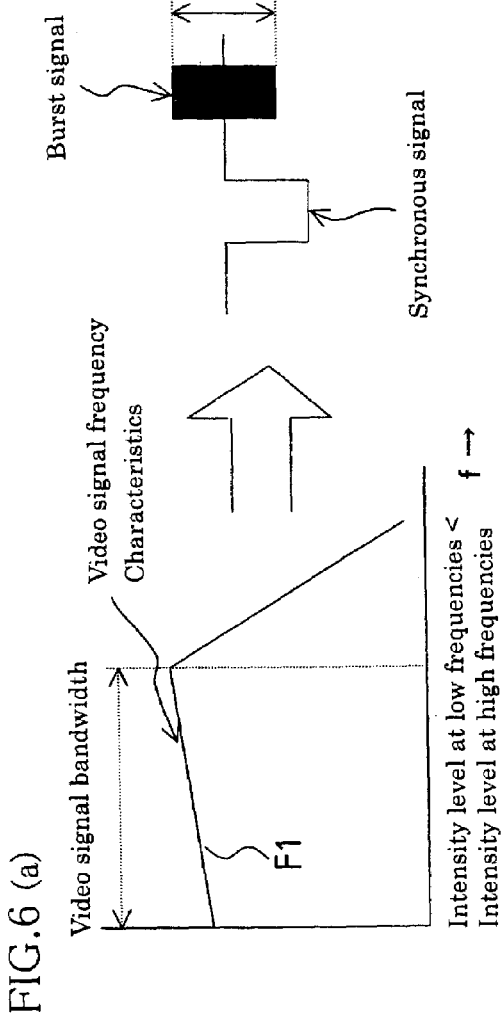
FIG. 6(*a*) is an explanatory diagram showing a burst signal in a case where video signal frequency characteristics are such that intensity levels in a high frequency band are higher than intensity levels in a low frequency band.
Figure 6:
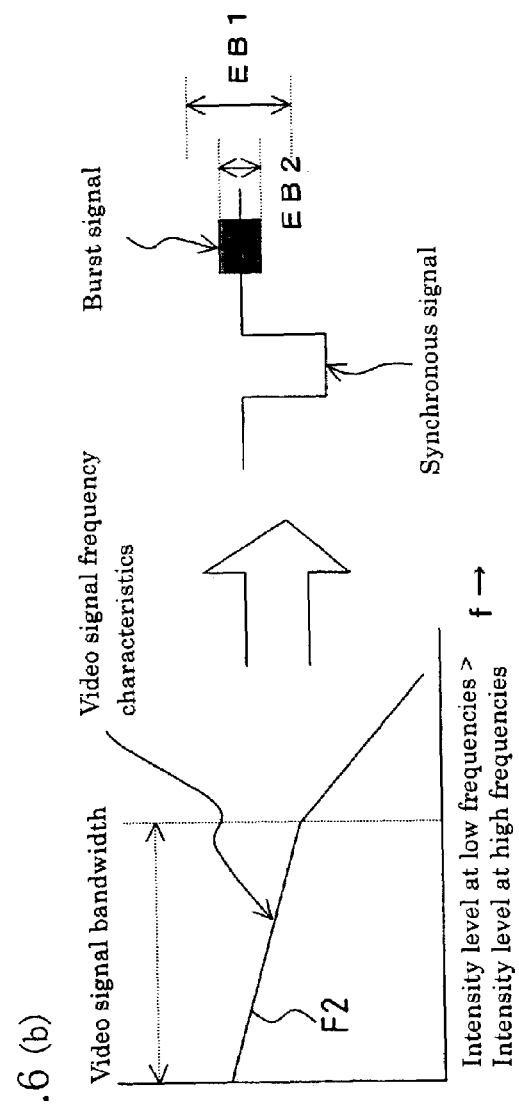

FIG. 5 is a circuit diagram of a frequency characteristics correction circuit corresponding to claim 5. This frequency characteristics correction circuit is such that coil L1, and the set of components comprising input tuning capacitor C1 and input tuning variable capacitance diode D1 which is connected in series thereto, are connected in parallel between an input signal line from an antenna, not shown, and ground, a BPF being formed by this coil L1, this input tuning capacitor C1, and this input tuning variable capacitance diode D1. In addition, change in the resonant frequency of the BPF is made possible through supply of voltage VT to the cathode side of input tuning variable capacitance diode D1 by way of resistor R1.

Furthermore, variable capacitance diode D2 is connected between the antenna input signal line and coil L1, DC voltage being supplied to the cathode side of variable capacitance diode D2 from control circuit 36 by way of resistor R2. Correction of the resonant frequency of the BPF is thus made possible through supply of DC voltage from control circuit 36 to the cathode side of variable capacitance diode D2 by way of resistor R2.

That is, variable capacitance diode D2 and resistor R2 represent important features in the present working example. In the present working example, resistor R2 serves as bias resistor for variable capacitance diode D2.

Figure 7:
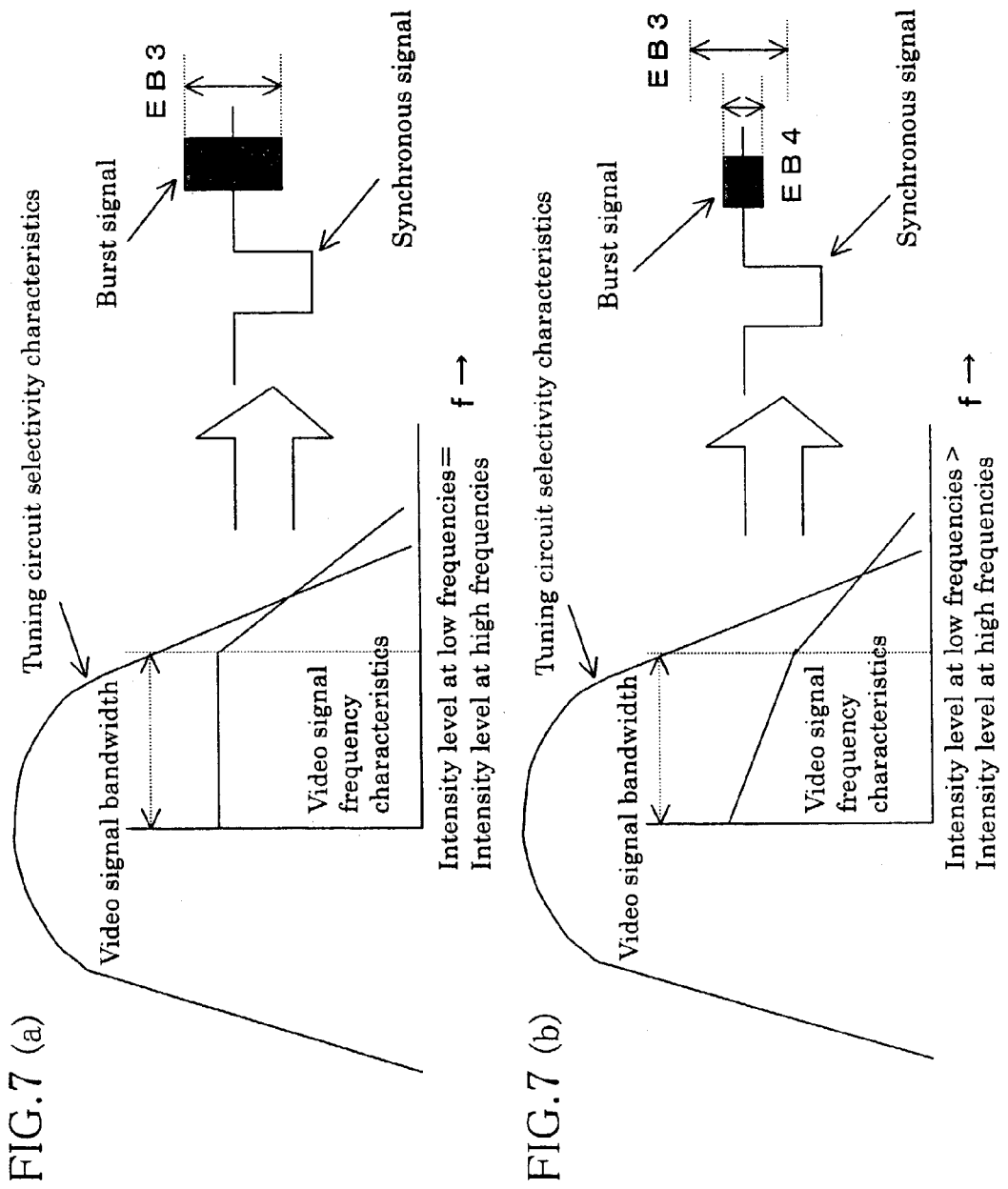
FIG. 7(*a*) is an explanatory diagram showing tuning circuit selectivity characteristics in a circuit in accordance with the present invention and standard video signal frequency characteristics, together with burst signal intensity level at such time.
Figure 8:
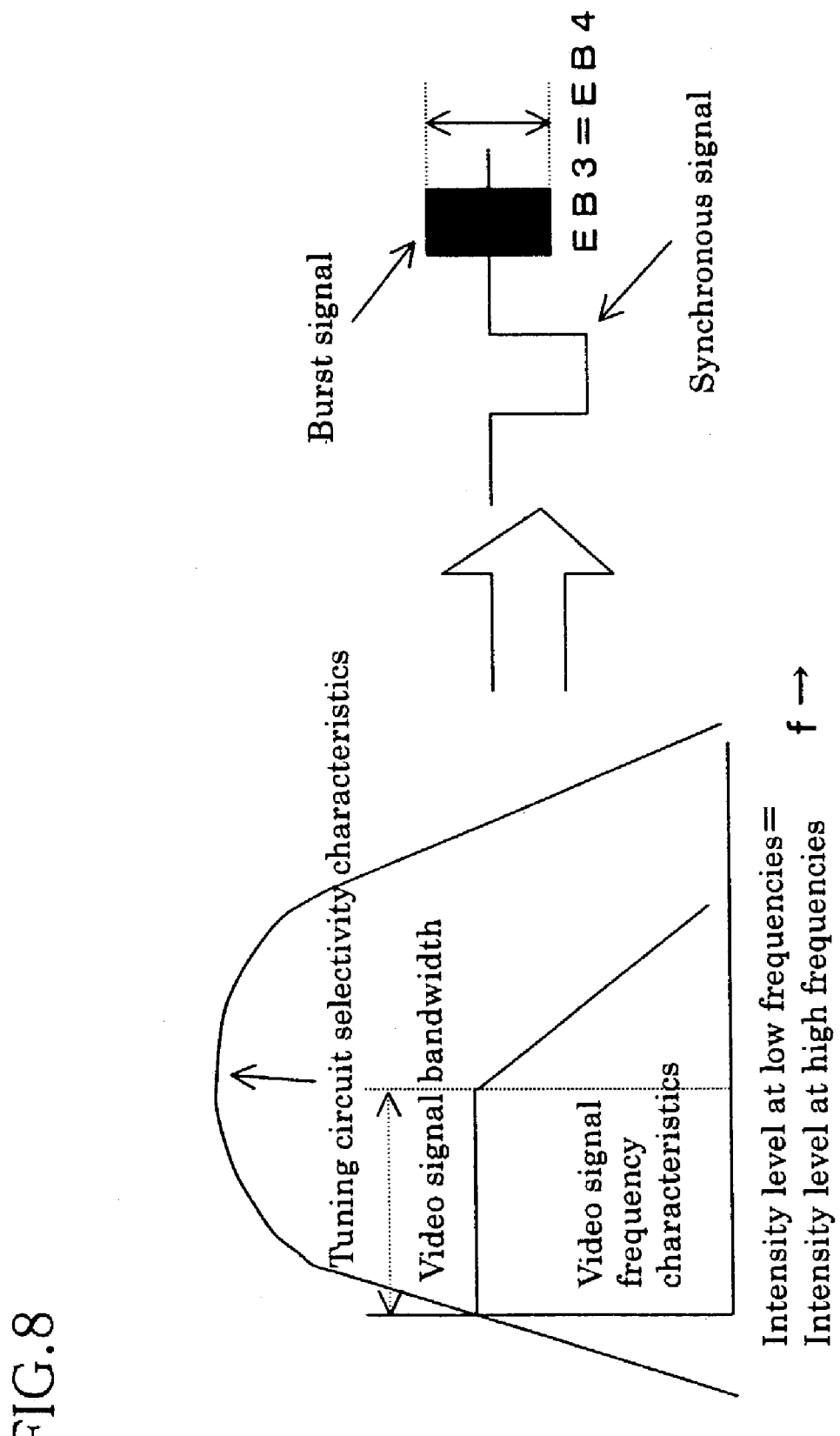
FIG. 8 is an explanatory diagram showing tuning circuit selectivity characteristics in a circuit in accordance with the present invention and video signal frequency characteristics obtained as a result of control carried out during occurrence of tracking error, together with burst signal intensity level at such time.

In the foregoing frequency characteristics correction circuit working examples 1 through 3, the structure therein is in each case such as to cause frequency characteristics to, for example, be as indicated at (a) in FIG. 7 when video signal frequency characteristics are such that intensity level in a high frequency band is the same as intensity level in a low frequency band, the intensity level of the burst signal present within the output signal thereof in such a case being EB3. On the other hand, in the event that video signal frequency characteristics are such that intensity level in a high frequency band is lower than intensity level in a low frequency band due to channel-to-channel variation, frequency characteristics might be as indicated at (b) in FIG. 7, intensity level of the burst signal present within the output signal thereof in such a case being EB4, where EB3>EB4. The intensity level of this burst signal is therefore converted into a DC voltage which is fed back to the frequency characteristics correction circuit by way of control circuit 36, the frequency characteristics correction circuit being controlled such that resonant frequency is varied as indicated at FIG. 8 so as to obtain the condition EB3=EB4, permitting burst intensity level (color intensity level) to be maintained at constant value(s). Note that while FIG. 8 only shows the situation for the case where video signal frequency characteristics are such that intensity level in a high frequency band is lower than intensity level in a low frequency band (FIG. 7(b)), similar control permits burst intensity levels (color intensity levels) to be maintained at constant value(s) in situations where video signal frequency characteristics are such that intensity level in a high frequency band is higher than intensity level in a low frequency band.

The present invention may be embodied in a wide variety of forms other than those presented herein without departing from the spirit or essential characteristics thereof. The foregoing embodiments and working examples, therefore, are in all respects merely illustrative and are not to be construed in limiting fashion. The scope of the present invention being as indicated by the claims, it is not to be constrained in any way whatsoever by the body of the specification. All modifications and changes within the range of equivalents of the claims are moreover within the scope of the present invention.

Moreover, the present application claims right of benefit of prior filing date of Japanese Patent Application No. 2002-044954, the content of which is incorporated herein by reference in its entirety. Furthermore, all references cited in the present specification are specifically incorporated herein by reference in their entirety.

What is claimed is:

1. A video signal processing apparatus comprising:
   one or more burst signal sampling means for extracting one or more burst signals from one or more video signals;
   one or more level converting means for converting to DC voltage or voltages at least one variable intensity level of at least one of the burst signal or signals extracted by at least one of the burst signal sampling means; and
   one or more image quality correcting means for causing at least one of the DC voltage or voltages obtained as a result of conversion by at least one of the level converting means to be fed back into one or more compensator subcircuits of one or more input tuning circuits so as to permit correction of frequency characteristics of at least one of the video signal or signals such that intensity level at one or more high frequency bands is constant relative to intensity level at one or more low frequency bands, wherein
   at least one of the compensator subcircuit or subcircuits includes one or more input tuning variable capacitance diodes;
   one or more sets of one or more capacitors connected in series to one or more variable capacitance diodes are connected in parallel to at least one of the input tuning variable capacitance diode or diodes; and
   at least one of the DC voltage or voltages is supplied by way of one or more intervening resistors to the cathode side of at least one of the input tuning variable capacitance diode or diodes.

2. A television comprising the video signal processing apparatus according to claim 1.

3. A video signal processing apparatus comprising:
   one or more burst signal sampling means for extracting one or more burst signals from one or more video signals;
   one or more level converting means for converting to DC voltage or voltages at least one variable intensity level of at least one of the burst signal or signals extracted by at least one of the burst signal sampling means; and
   one or more image quality correcting means for causing at least one of the DC voltage or voltages obtained as a result of conversion by at least one of the level converting means to be fed back into one or more compensator subcircuits of one or more input tuning circuits so as to permit correction of frequency characteristics of at least one of the video signal or signals such that intensity level at one or more high frequency bands is constant relative to intensity level at one or more low frequency bands, wherein
   at least one of the compensator subcircuit or subcircuits includes one or more input tuning variable capacitance diodes;
   at least one of the compensator subcircuit or subcircuits comprises one or more sets of one or more input tuning capacitors connected in series to the one or more input tuning variable capacitance diodes;
   one or more sets of one or more additional capacitors connected in series to one or more additional variable capacitance diodes is or are connected in parallel to at least one of the set or sets of input tuning capacitor or capacitors and input tuning variable capacitance diode or diodes; and
   at least one of the DC voltage or voltages is supplied by way of one or more intervening resistors to the cathode side of at least one of the input tuning variable capacitance diode or diodes.

4. A television comprising the video signal processing apparatus according to claim 3.

5. A video signal processing apparatus comprising:
   one or more burst signal sampling means for extracting one or more burst signals from one or more video signals;
   one or more level converting means for converting to DC voltage or voltages at least one variable intensity level of at least one of the burst signal or signals extracted by at least one of the burst signal sampling means; and
   one or more image quality correcting means for causing at least one of the DC voltage or voltages obtained as a result of conversion by at least one of the level converting means to be fed back into one or more compensator subcircuits of one or more input tuning circuits so as to permit correction of frequency characteristics of at least one of the video signal or signals such that intensity level at one or more high frequency bands is constant relative to intensity level at one or more low frequency bands, wherein at least one of the compensator subcircuit or subcircuits includes one or more input tuning variable capacitance diodes;

at least one of the compensator subcircuit or subcircuits comprises one or more input tuning coils and one or more input tuning capacitors;

one or more variable capacitance diode or diodes is or are connected between at least one of the input tuning coil or coils and at least one of the input tuning capacitor or capacitors; and at least one of the DC voltage or voltages is supplied by way of one or more intervening resistors to the cathode side of at least one of the input tuning variable capacitance diode or diodes.

6. A television comprising the video signal processing apparatus according to claim 5.

7. A video signal processing apparatus comprising:

a tuner;

burst sampling circuitry for extracting burst signals from video signals from the tuner; and level converting circuitry for converting levels of the extracted burst signals to a DC control voltage, wherein the tuner is controlled by the DC control voltage to compensate frequency characteristics so that an intensity level of the video signals from the tuner is substantially uniform across high and low frequency bands, and wherein the tuner comprises:

an inductance coupled between a video signal line and a specified potential;

a first capacitance and a first variable capacitance diode coupled in series between the video signal line and the specified potential, a variable tuning voltage being supplied to the cathode of the first variable capacitance diode; and a second capacitance and a second variable capacitance diode coupled in series between the cathode of the first variable capacitance diode and the specified potential, the DC control voltage being supplied to the cathode of the second variable capacitance diode.

8. The video signal processing apparatus according to claim 7, wherein the tuner is an input tuner.

9. The video signal processing apparatus according to claim 7, wherein the tuner is an interstage tuner.

10. A television comprising the video signal processing apparatus according to claim 7.

11. A video signal processing apparatus comprising:

one or more burst signal sampling means for extracting one or more burst signals from one or more video signals;

one or more level converting means for converting to DC voltage or voltages at least one variable intensity level of at least one of the burst signal or signals extracted by at least one of the burst signal sampling means; and one or more image quality correcting means for causing at least one of the DC voltage or voltages obtained as a result of conversion by at least one of the level converting means to be fed back into one or more compensator subcircuits of one or more input tuning circuits so as to permit correction of frequency characteristics of at least one of the video signal or signals such that intensity level at one or more high frequency bands is constant relative to intensity level at one or more low frequency bands, wherein at least one of the compensator subcircuit or subcircuits includes one or more interstage tuning variable capacitance diodes;

at least one of the compensator subcircuits or subcircuits comprises one or more input tuning coils and one or more input tuning capacitors;

one or more variable capacitance diode or diodes is or are connected between at least one of the input tuning coil or coils and at least one of the input tuning capacitor or capacitors; and at least one of the DC voltage or voltages is supplied by way of one or more intervening resistors to the cathode side of at least one of the input tuning variable capacitance diode or diodes.

12. A television comprising the video signal processing apparatus according to claim 11.

13. A video signal processing apparatus comprising:

one or more burst signal sampling means for extracting one or more burst signals from one or more video signals;

one or more level converting means for converting to DC voltage or voltages at least one variable intensity level of at least one of the burst signal or signals extracted by at least one of the burst signal sampling means; and one or more image quality correcting means for causing at least one of the DC voltage or voltages obtained as a result of conversion by at least one of the level converting means to be fed back into one or more compensator subcircuits of one or more interstage tuning circuits so as to permit correction of frequency characteristics of at least one of the video signal or signals such that intensity level at one or more high frequency bands is constant relative to intensity level at one or more low frequency bands, wherein at least one of the compensator subcircuit or subcircuits includes one or more interstage tuning variable capacitance diodes;

at least one of the compensator subcircuit or subcircuits comprises one or more sets of one or more interstage tuning capacitors connected in series to the one or more interstage tuning variable capacitance diodes;

one or more sets of one or more additional capacitors connected in series to one or more additional variable capacitance diodes is or are connected in parallel to at least one of the set or sets of interstage tuning capacitor or capacitors and interstage tuning variable capacitance diode or diodes; and at least one of the DC voltage or voltages is supplied by way of one or more intervening resistors to the cathode side of at least one of the interstage tuning variable capacitance diode or diodes.

14. A television comprising the video signal processing apparatus according to claim 13.

15. A video signal processing apparatus comprising:

one or more burst signal sampling means for extracting one or more burst signals from one or more video signals;

one or more level converting means for converting to DC voltage or voltages at least one variable intensity level of at least one of the burst signal or signals extracted by at least one of the burst signal sampling means; and one or more image quality correcting means for causing at least one of the DC voltage or voltages obtained as a result of conversion by at least one of the level converting means to be fed back into one or more compensator subcircuits of one or more interstage tuning circuits so as to permit correction of frequency characteristics of at least one of the video signal or signals such that intensity level at one or more high frequency bands is constant relative to intensity level at one or more low frequency bands, wherein at least one of the compensator subcircuit or subcircuits includes one or more interstage tuning variable capacitance diodes;

at least one of the compensator subcircuit or subcircuits comprises one or more interstage tuning coils and one or more interstage tuning capacitors;

one or more variable capacitance diode or diodes is or are connected between at least one of the interstage tuning coil or coils and at least one of the interstage tuning capacitor or capacitors; and at least one of the DC voltage or voltages is supplied by way of one or more intervening resistors to the cathode side of at least one of the interstage tuning variable capacitance diode or diodes.

16. A television comprising the video signal processing apparatus according to claim 15.

17. A video signal processing apparatus comprising:
a tuner;
burst sampling circuitry for extracting burst signals from video signals from the tuner; and
level converting circuitry for converting levels of the extracted burst signals to a DC control voltage,
wherein the tuner is controlled by the DC control voltage to compensate frequency characteristics so that an intensity level of the video signals from the tuner is substantially uniform across high and low frequency bands, and
wherein the tuner comprises:
an inductance coupled between a video signal line and a specified potential;
a first capacitance and a first variable capacitance diode coupled in series between the video signal line and the specified potential, a variable tuning voltage being supplied to the cathode of the first variable capacitance diode; and
a second capacitance and a second variable capacitance diode coupled in series between the video signal line and the specified potential, the DC control voltage being supplied to the cathode of the second variable capacitance diode.

18. A television comprising the video signal processing apparatus according to claim 17.

19. A video signal processing apparatus comprising:
a tuner;
burst sampling circuitry for extracting burst signals from video signals from the tuner; and
level converting circuitry for converting levels of the extracted burst signals to a DC control voltage,
wherein the tuner is controlled by the DC control voltage to compensate frequency characteristics so that an intensity level of the video signals from the tuner is substantially uniform across high and low frequency bands, and
wherein the tuner comprises:
an inductance and a diode connected in series between a video signal line and a specified potential;
a capacitance and a variable capacitance diode coupled in series between the video signal line and the specified potential, a variable tuning voltage being supplied to the cathode of the first variable capacitance diode; and
a resistance through which the DC control voltage is supplied to the video signal line.

20. A television comprising the video signal processing apparatus according to claim 19.

* * * * *